United States Patent
Nishiya et al.

(10) Patent No.: US 6,706,321 B2
(45) Date of Patent: Mar. 16, 2004

(54) DEVELOPING TREATMENT METHOD AND DEVELOPING TREATMENT UNIT

(75) Inventors: Akira Nishiya, Kumamoto (JP); Kazuo Sakamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 25 days.

(21) Appl. No.: 09/867,688

(22) Filed: May 31, 2001

(65) Prior Publication Data
US 2001/0050050 A1 Dec. 13, 2001

(30) Foreign Application Priority Data

Jun. 13, 2000 (JP) ........................................ 2000-176777

(51) Int. Cl.$^7$ ............................................... B05D 3/12
(52) U.S. Cl. ........................ 427/240; 427/425; 118/52; 118/320; 118/321; 438/758; 396/604; 430/313; 430/434
(58) Field of Search ................................ 427/240, 425; 118/52, 320, 321; 438/758; 396/604; 430/313, 434

(56) References Cited

U.S. PATENT DOCUMENTS

| 5,740,488 A | 4/1998 | Fujimoto ................ 396/604 |
| 5,815,762 A | 9/1998 | Sakai et al. .............. 396/611 |
| 5,821,035 A | 10/1998 | Hirano et al. ............. 430/311 |
| 5,962,070 A | 10/1999 | Mitsuhashi et al. ........ 427/240 |
| 5,984,540 A | 11/1999 | Mimasaka et al. ........ 396/604 |
| 6,248,175 B1 * | 6/2001 | Subramanian et al. ...... 118/712 |
| 6,270,579 B1 * | 8/2001 | Subramanian et al. ...... 118/663 |

FOREIGN PATENT DOCUMENTS

JP 63-132420 A * 6/1988

OTHER PUBLICATIONS

English translation of JP 63–132429 A, published Jun. 4, 1988.*

* cited by examiner

Primary Examiner—Michael Barr
Assistant Examiner—Kirsten Crockford Jolley
(74) Attorney, Agent, or Firm—Rader, Fishman & Grauer PLLC

(57) ABSTRACT

The present invention relates to a method of supplying a developing solution to a surface of a substrate to perform developing treatment for the substrate, comprising a first step of supplying the developing solution to the surface of the substrate while a developing solution supply nozzle is moving relative to the substrate and a second step of developing the substrate for a first predetermined period of time, and the second step has the step of stirring the developing solution on the surface of the substrate after a second predetermined period of time from the completion of the first step. Because of stirring, the concentration of the developing solution on the substrate is made uniform, resulting in a rise in the uniformity of developing treatment.

14 Claims, 10 Drawing Sheets

DEVELOPING TREATMENT METHOD AND DEVELOPING TREATMENT UNIT

BACKGROUND OF THE INVENTION

1. Field of the Invention

The present invention relates to a developing treatment method and a developing treatment unit for a substrate.

2. Description of the Related Art

In photolithography of the process of fabricating a semiconductor device, for example, resist coating treatment for coating the surface of a wafer with a resist solution to form a resist film thereon, exposure processing for exposing a pattern on the wafer, developing treatment for developing the exposed wafer, and the like are performed in sequence to form a predetermined circuit pattern on the wafer.

In the aforesaid developing treatment, usually a developing solution supply nozzle which is formed longer than a diameter of the wafer and has a plurality of supply ports along its longitudinal direction moves from one end to the other end of the wafer while discharging a developing solution onto the wafer, whereby the developing solution is supplied to the entire surface of the wafer. After a developing solution film is formed on the wafer, the wafer is developed while remaining stationary in that state for a predetermined period of time. On this occasion, on the wafer, a resist film and the developing solution at an exposed portion which becomes soluble in the developing solution by exposure chemically react with each other to dissolve the exposed portion, whereby the developing of the wafer progresses.

However, it is found by experiment by the inventor, et al. that when the developing solution supply nozzle supplies the developing solution while moving in a predetermined direction as described above, there occurs a so-called flow phenomenon of the developing solution, in which the supplied developing solution flows in a direction opposite to a moving direction of the developing solution supply nozzle, that is, in a direction from the other end to the one end of the wafer.

When the developing solution with a high concentration which is at an unexposed portion and not yet used for a chemical reaction flows into an adjacent exposed portion under such a phenomenon, however, the chemical reaction speed at this exposed portion increases, and hence the developing speed at this portion increases compared with other portions. As a result, a line width at this portion becomes narrower compared with those at other portions.

Meanwhile, when the developing solution with a low concentration which is at an exposed portion and used for a chemical reaction flows into an adjacent exposed portion, the reaction speed at this exposed portion decreases, and hence the developing speed at this portion decreases, whereby a line width at this position becomes wider compared with those at other portions. Specifically, the developing speed within the surface of the wafer becomes ununiform due to the aforesaid phenomenon, which causes unevenness of line width of a circuit pattern finally formed on the wafer.

SUMMARY OF THE INVENTION

The present invention is made in view of the aforesaid point, and its object is to provide a developing treatment method and a developing treatment unit for eliminating the ununiformity of developing speed within the surface of a substrate such as a wafer caused by the aforesaid flow phenomenon of a developing solution, finally leading to the formation of uniform line width on the substrate.

The present invention is a method of supplying a developing solution to a surface of a substrate to perform developing treatment for the substrate, comprising: a first step of supplying the developing solution to the surface of the substrate while a developing solution supply nozzle is moving relative to the substrate; and a second step of developing the substrate for a first predetermined period of time, the second step having the step of stirring the developing solution on the surface of the substrate after a second predetermined period of time from the completion of the first step.

The stirring step is performed, for example, by rotating the substrate.

It is desirable that the substrate be rotated so that a thickness of the developing solution after the step of stirring the developing solution is not less than a predetermined thickness. Moreover, the step of measuring a thickness of the developing solution after the step of stirring the developing solution and the step of changing a rotation time of the substrate based on the measurement may be further added. Alternatively, the step of measuring a thickness of the developing solution after the step of stirring the developing solution and the step of changing a rotation speed of the substrate based on the measurement may be further added. Alternatively, the step of measuring a thickness of the developing solution after the step of stirring the developing solution and the step of changing a rotation acceleration of the substrate based on the measurement may be further added.

A developing treatment unit of the present invention is a unit for performing developing treatment for a substrate by supplying a developing solution to a surface of the substrate while moving a developing solution supply nozzle relative to the substrate, comprising: a rotary drive member for holding and rotating the substrate; and a rotation controller for normally and reversely rotating the rotary drive member after the supply of the developing solution.

According to the present invention, even if such a flow phenomenon of the developing solution as described above occurs, by stirring the developing solution on the surface of the substrate during the second step in which the substrate is being developed, both an exposed portion and an unexposed portion are covered with the developing solution with a uniform concentration, whereby the developing speed is made uniform within the surface of the substrate. According to the knowledge of the inventor, et al., reaction products created by the progress of developing are scattered by stirring, whereby the concentration of the developing solution is made uniform.

The above is realized irrespective of pattern spacing. Accordingly, the ununiformity of line width of a circuit pattern finally formed on the substrate is suppressed. The reason why the stirring step is performed after the second predetermined period of time from the completion of the first step is that immediately after the start of developing, the chemical reaction of the developing solution does not progress so much, hence the concentration of the developing solution is the same within the surface of the substrate, and thus stirring at this point hinders developing rather than has an effect on developing. It is desirable that the second predetermined period of time be a period of time from the supply of the developing solution onto the substrate to approximately 50% to 80% progress of the chemical reaction of developing at the exposed portion, and, for example, when the first predetermined period of time is approximately 60 sec., it is desirable that the second predetermined period of time be approximately 3 sec. to 15 sec. from the result of model experiment by the inventor.

If stirring is performed by rotating the substrate, the developing solution on the substrate is moved by centrifugal force and stirred at the same time. Incidentally, it is important to rotate the substrate for an appropriate period of time and at an appropriate rotation speed and rotation acceleration, and especially as for the rotation speed, 100 rpm to 1000 rpm in case of a wafer with the size of 8 in. and 30 rpm to 1000 rpm in case of a wafer with the size of 12 in. are preferable from the result of the model experiment by the inventor. As for the rotation time, approximately two seconds are preferable. Stirring may be performed in other ways, for example, by giving vibration to the substrate.

It is important that the aforesaid rotation of the substrate is performed so that the thickness of the developing solution after the step of stirring the developing solution is not less than a predetermined thickness. This is because if the developing solution on the substrate is excessively cast off due to the rotation of the substrate and the developing solution film becomes too thin, there occurs such a harmful effect that the developing solution dries and thereby developing is not appropriately performed in developing treatment thereafter. The thickness of the developing solution film is adjusted by controlling the rotation time, rotation speed, and rotation acceleration of the substrate. According to an experimental result by the inventor, it is preferable that the thickness is not less than 8 $\mu$m.

By measuring the thickness after the completion of the second step and controlling the rotation time, rotation speed, and rotation acceleration, developing treatment can be performed under more appropriate conditions.

In the aforesaid invention, the first step may be performed by supplying the developing solution to the substrate while the developing solution supply nozzle is moving from one end to the other end of the substrate. When the developing solution film is formed on the substrate by such a movement of the developing solution supply nozzle from the one end to the other end of the substrate, the developing solution to be supplied has a speed in a fixed direction with respect to the substrate, whereby the influence of the aforesaid flow phenomenon of the developing solution is exhibited remarkably. Hence, the aforesaid performance of the stirring step during the step of developing the substrate is significant.

In this case, the step of supplying the developing solution again to the surface of the substrate while moving the developing solution supply nozzle this time in an opposite direction, that is, from the other end to the one end of the substrate after stirring may be further provided, which can further enhance the uniformity of developing treatment.

According to the developing treatment unit of the present invention, the aforesaid stirring can be properly performed by normally and reversely rotating the substrate.

DETAILED DESCRIPTION OF THE PREFERRED EMBODIMENT

Figure 1:
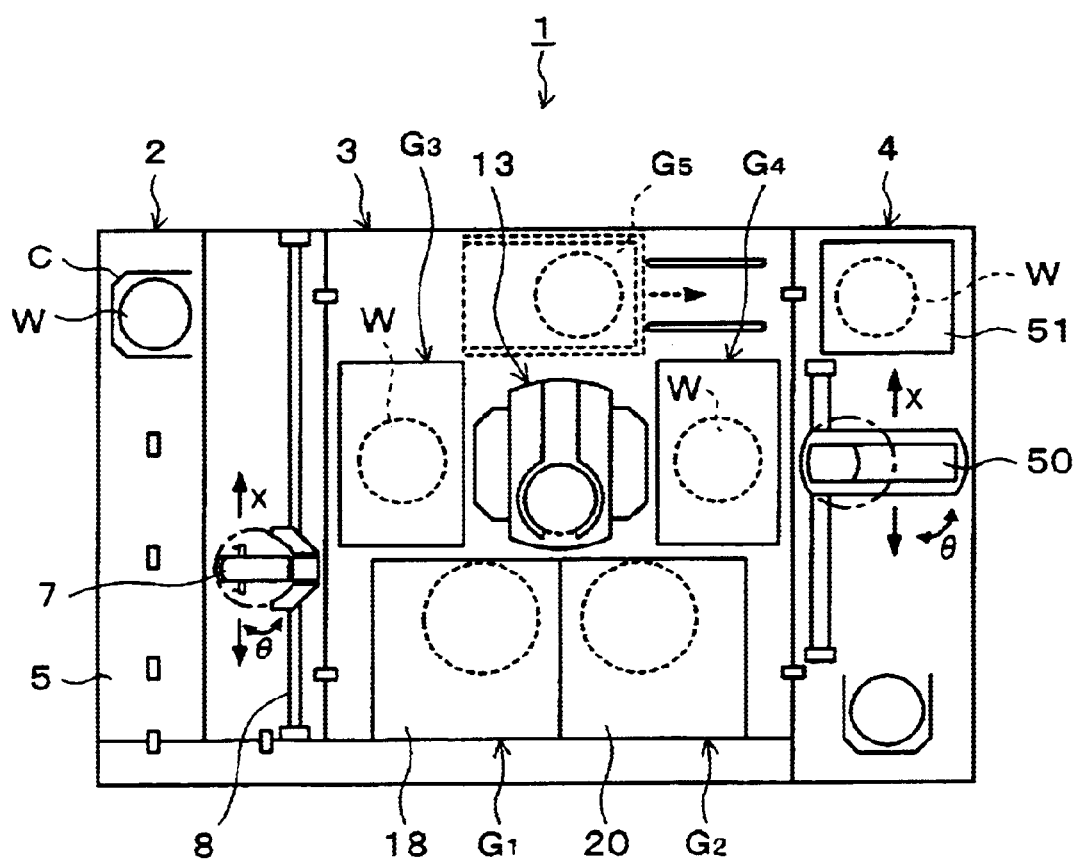
FIG. 1 is an explanatory view of a plan of a coating and developing treatment system including a developing treatment unit used in a developing treatment method according to an embodiment.
Figure 2:
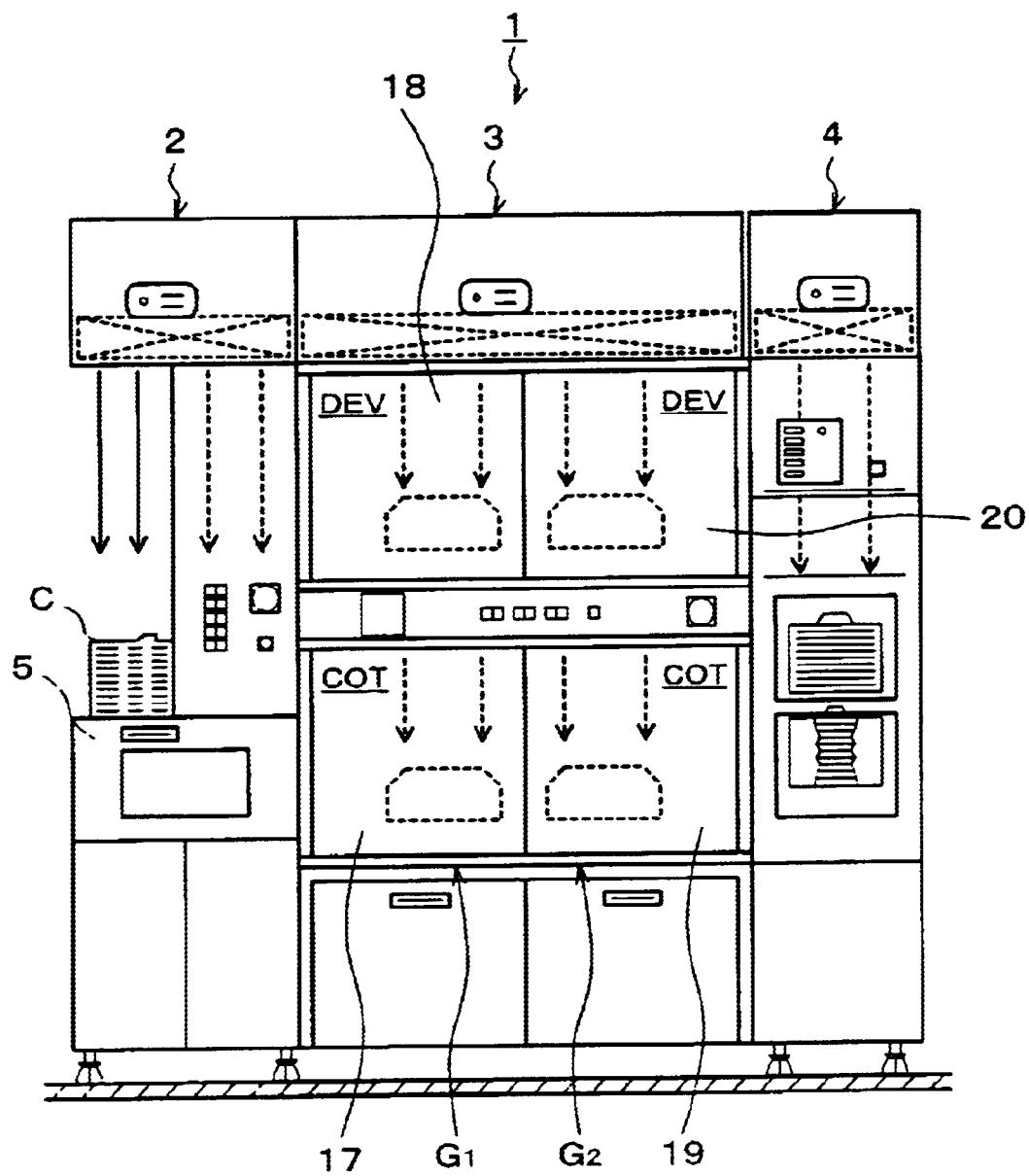
FIG. 2 is a front view of the coating and developing treatment system in FIG. 1.
Figure 3:
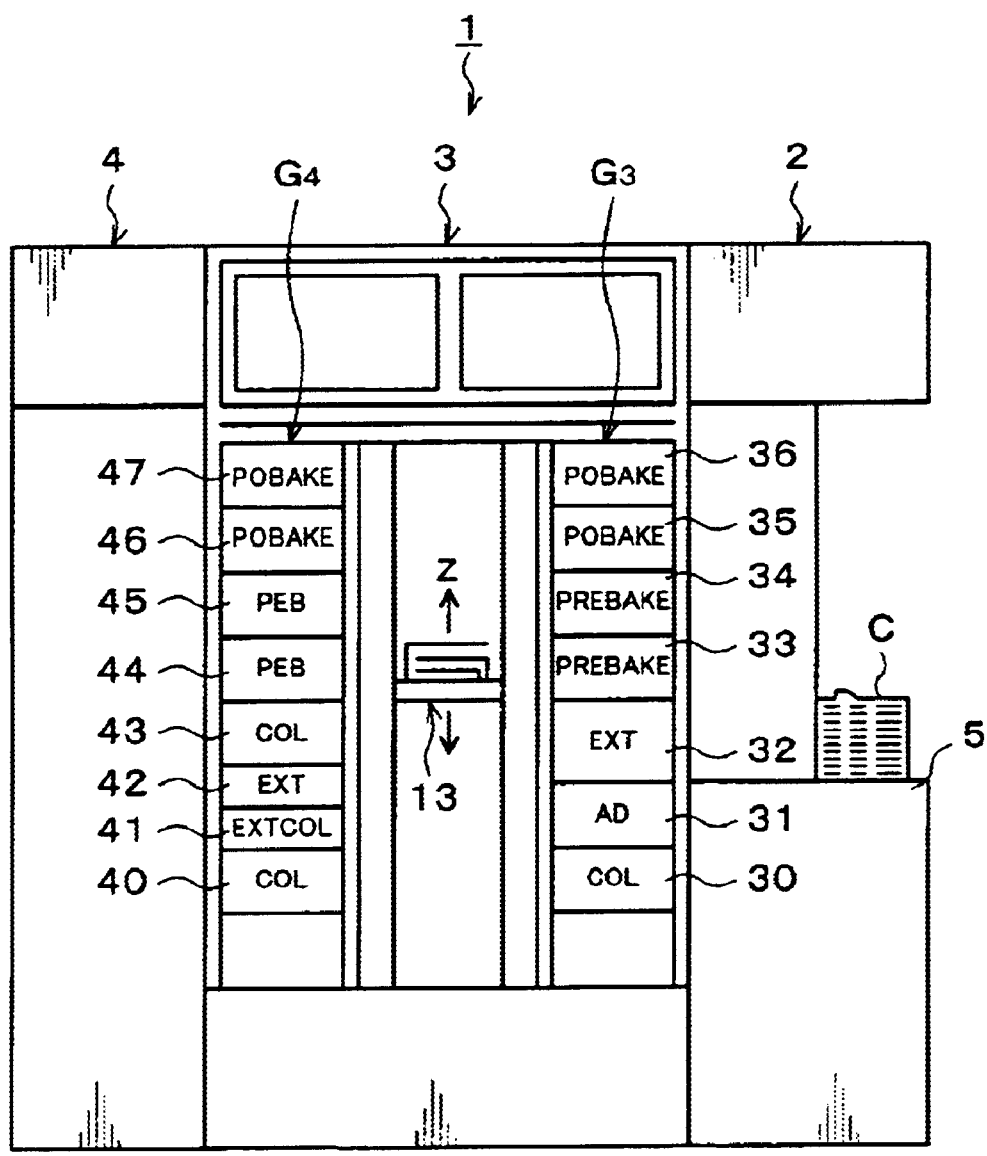
FIG. 3 is a rear view of the coating and developing treatment system in FIG. 1.

A preferred embodiment of the present invention will be explained below. A developing treatment method according to this embodiment is carried out by a developing treatment unit. FIG. 1 is a plan view of a coating and developing treatment system 1 including the developing treatment unit, FIG. 2 is a front view of the coating and developing treatment system 1, and FIG. 3 is a rear view of the coating and developing treatment system 1.

As shown in FIG. 1, the coating and developing treatment system 1 has a structure in which a cassette station 2 for carrying, for example, 25 wafers W per cassette, as a unit, from/to the outside into/out of the coating and developing treatment system 1 and carrying the wafer W into/out of a cassette C, a processing station 3 in which various kinds of treatment units each for performing predetermined treatment for the wafers W one by one in coating and developing treatment processes are stacked in multiple tiers, and an interface section 4 for receiving/sending the wafer W from/to an aligner not illustrated but provided adjacent to the processing station 3 are integrally connected.

In the cassette station 2, a plurality of cassettes C can be mounted at predetermined positions on a cassette mounting table 5 which is a mounting portion in a line in an X-direction (a top-to-bottom direction in FIG. 1). A wafer carrier 7 which is movable in the direction of arrangement of the cassettes (the X-direction) and in the direction of arrangement of the wafers W housed in the cassette C (a Z-direction; a vertical direction) is provided to be movable along a carrier guide 8 so as to selectively get access to each cassette C.

The wafer carrier 7 has an alignment function of aligning the wafer W. The wafer carrier 7 is structured to be able to get access also to an extension unit 32 included in a third treatment unit group G3 on the processing station 3 side as will be described later.

In the processing station 3, a main carrier unit 13 is provided at the center thereof, and various kinds of treatment units are stacked in multiple tiers around the main carrier unit 13 to compose treatment unit groups. In the coating and developing treatment system 1, four treatment unit groups G1, G2, G3, and G4 are disposed. The first and second treatment unit groups G1 and G2 are disposed on the front side of the coating and developing treatment system 1, the third treatment unit group G3 is disposed adjacent to the cassette station 2, and the fourth treatment unit group G4 is disposed adjacent to the interface section 4. Further, a fifth treatment unit group G5 shown by a broken line can be additionally disposed on the rear side as an option. The main carrier unit 13 can carry the wafer W into/out of various treatment units which are arranged in the treatment unit groups G1, G2, G3 and G4 and will be described later. It should be noted that the number and disposition of treatment unit groups are different depending on the type of treatment, and the number of treatment unit groups is optional.

In the first treatment unit group G1, for example, as shown in FIG. 2, a resist coating unit 17 for coating the wafer W with a resist solution and a developing treatment unit 18 in which the developing treatment method according to this embodiment is carried out are stacked in two tiers from the bottom in order. Similarly, in the second treatment unit group G2, a resist coating unit 19 and a developing treatment unit 20 are stacked in two tiers from the bottom in order.

In the third treatment unit group G3, for example, as shown in FIG. 3, a cooling unit 30 for subjecting the wafer W to cooling treatment, an adhesion unit 31 for enhancing the adhesion of the resist solution and the wafer W, an extension unit 32 for making the wafer W wait therein, pre-baking units 33 and 34 each for drying a solvent in the resist solution, post-baking units 35 and 36 each for performing baking treatment after developing treatment, or the like are stacked, for example, in seven tiers from the bottom in order.

In the fourth treatment unit group G4, for example, a cooling unit 40, an extension and cooling unit 41 for naturally cooling the wafer W mounted therein, an extension unit 42, a cooling unit 43, post-exposure baking units 44 and 45 each for performing baking treatment after exposure processing, post-baking units 46 and 47, or the like are stacked, for example, in eight tiers from the bottom in order.

A wafer carrier 50 is provided at the center of the interface section 4. The wafer carrier 50 is structured to be movable in the X-direction (the top-to-bottom direction in FIG. 1) and in the Z-direction (the vertical direction) and rotatable in a θ-direction (a direction of rotation around a Z-axis) so as to get access to the extension and cooling unit 41 and the extension unit 42 included in the fourth treatment unit group G4, a periphery exposure unit 51, and the aligner not illustrated to carry the wafer W to each of them.

Figure 4:
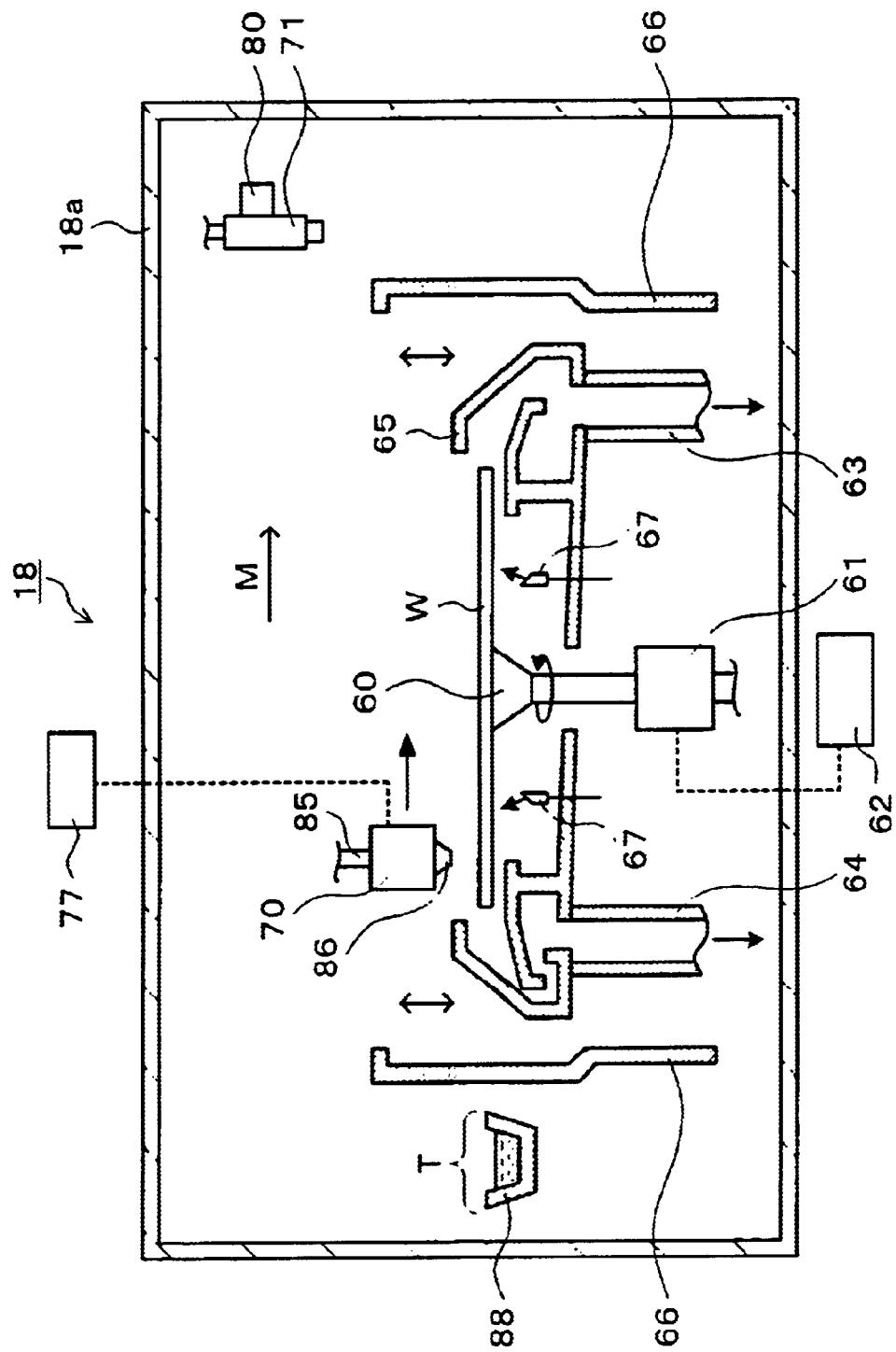
FIG. 4 is an explanatory view of a vertical section of the developing treatment unit used in the embodiment.
Figure 5:
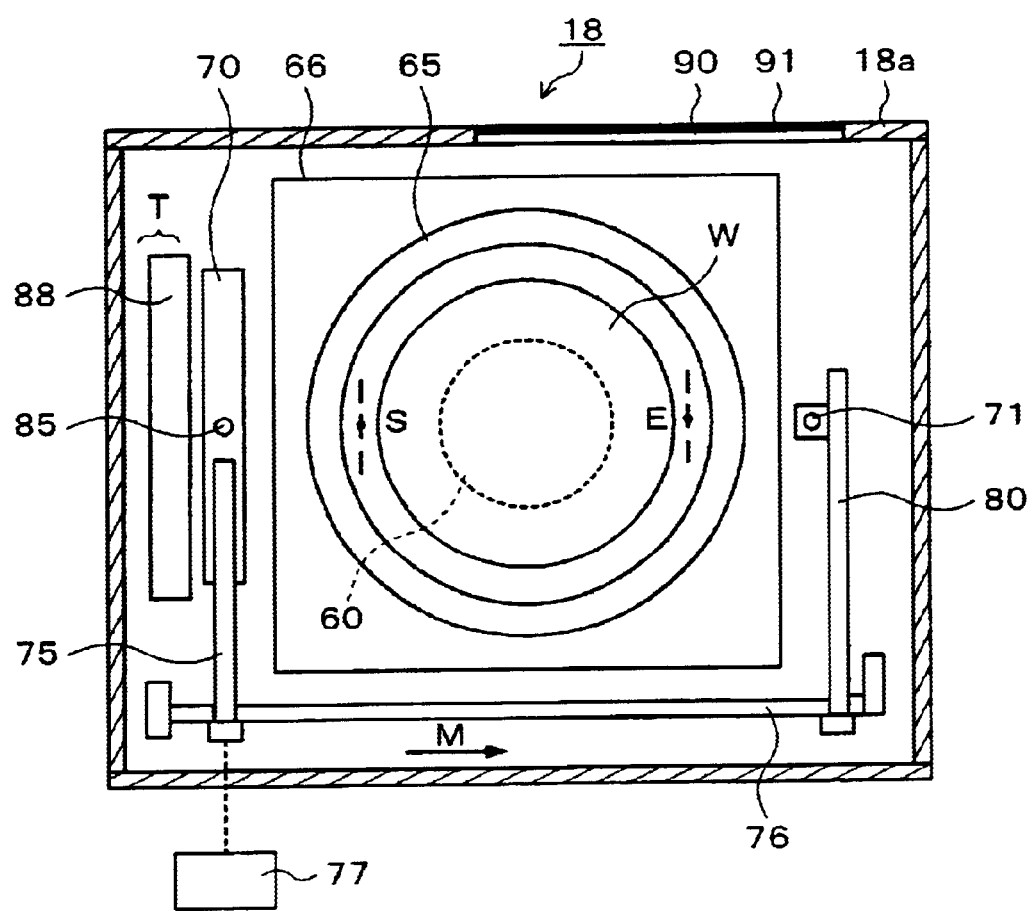
FIG. 5 is an explanatory view of a horizontal section of the developing treatment unit used in the embodiment.

Next, the structure of the aforesaid developing treatment unit 18 will be explained in detail. As shown in FIGS. 4 and 5, a spin chuck 60 which is a suction-holder for sucking and holding the wafer W is provided in a casing 18a of the developing treatment unit 18. A rotary drive mechanism 61 having, for example, a motor or the like, for rotating the spin chuck 60 is provided under the spin chuck 60. The operation of the rotary drive mechanism 61 is rotatably controlled by a rotation controller 62, and the rotary drive mechanism 61 is structured to be able to rotate the wafer W for a predetermined rotation time and at a predetermined rotation speed and rotation acceleration or to stop the wafer W. The rotary drive mechanism 61 of the spin chuck 60 also has a function of freely moving the spin chuck 60 up and down, whereby the wafer W can be delivered from/to the main carrier unit 13 by moving the spin chuck 60 up and down when the wafer W is carried in/out.

An annular cup 65 with its upper face open is provided outside the outer periphery of the spin chuck 60 to surround the outer periphery of the spin chuck 60 so as to catch the developing solution and the like scattered from the wafer W which is suction-held on the spin chuck 60 and rotated, thereby preventing the units therearound from being contaminated. A drain pipe 63 for draining the developing solution and the like scattered from the wafer W and the like and an exhaust pipe 64 for exhausting an atmosphere in the cup 65 are provided at the bottom of the cup 65. Further, provided in the cup 65 are rear face washing nozzles 67 for supplying a washing solution to the rear face of the wafer W held on the spin chuck 60 to wash the rear face of the wafer W. A drive mechanism not illustrated is provided in the cup 65, whereby the entire cup 65 can move up and down and evade downward so as not to hinder the movement of a developing solution supply nozzle 70 which will be described later.

An outer cup 66 in a square form with its upper face open is provided outside the cup 65 to surround the cup 65 and catches the developing solution and the like from the wafer W and the developing solution supply nozzle 70 described later, which can not be caught by the aforesaid cup 65. Incidentally, the outer cup 66 is provided with a drive mechanism not illustrated for moving the outer cup 66 up and down, and when the wafer W is washed, for example, the outer cup 66 moves up to collect the scattered washing solution and the like more completely.

Inside the casing 18a, as shown in FIG. 5, the developing solution supply nozzle 70 as a developing solution supply nozzle for supplying the developing solution to the wafer W, and a washing nozzle 71 for supplying the washing solution to the upper face of the wafer W are provided on both sides with the outer cup 66 between them.

The developing solution supply nozzle 70, as shown in FIG. 5, is held in such a manner to be hung from an arm 75. The arm 75 is structured to be freely movable on a rail 76 which extends in one direction (a direction shown by the arrow M in FIG. 5) in the casing 18a, and its moving speed and moving timing are controlled by a movement controller 77. The aforesaid structure allows the developing solution supply nozzle 70 to move above and parallel to the wafer W along the aforesaid M-direction. The aforesaid arm 75 has a structure including a motor and the like so as to move in the vertical direction to optimally adjust the distance between the tip of a discharge port of the developing solution supply nozzle 70 and the wafer W when the developing solution is supplied.

Meanwhile, the washing nozzle 71 which discharges the washing solution, for example, pure water is supported by a rinse arm 80. This rinse arm 80 is structured to be freely movable on the rail 76 by a drive mechanism not illustrated. Accordingly, the washing nozzle 71 is movable in the M-direction similarly to the developing solution supply nozzle 70. The washing nozzle 71 is located to be able to supply the washing solution to the center of the wafer W, for example, when the rinse arm 80 is positioned above the center of the wafer W. Thus, the washing solution supplied onto the wafer W which is being rotated is spread over the entire surface of the wafer W to thereby uniformly wash the entire surface of the wafer W. Incidentally, the washing nozzle 71 may supply the washing solution onto the wafer W while moving from the center to the peripheral edge of the wafer W.

Figure 6:
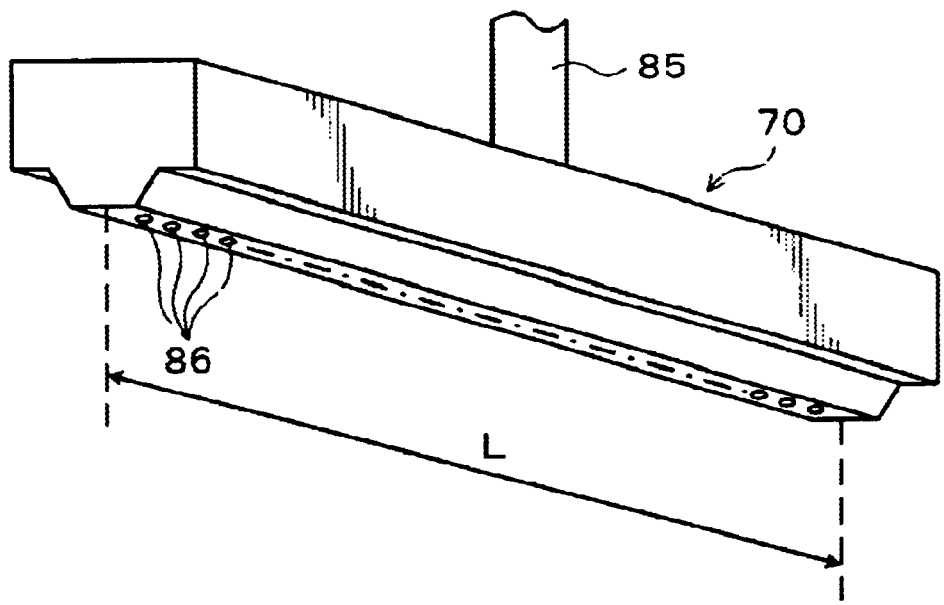
FIG. 6 is a perspective view of a developing solution supply nozzle used in the developing treatment unit in FIG. 4.

The developing solution supply nozzle 70, as shown in FIG. 5 and FIG. 6, has an elongated form as a whole, and its length L is at least larger than a diameter of the wafer W. One end of a pipe 85 for allowing the developing solution to flow from a developing solution supply source not illustrated into the developing solution supply nozzle 70 is connected to the top of the developing solution supply nozzle 70. The lower portion of the developing solution supply nozzle 70 is provided with a plurality of developing solution supply ports 86 in a line in the longitudinal direction thereof.

Figure 7:
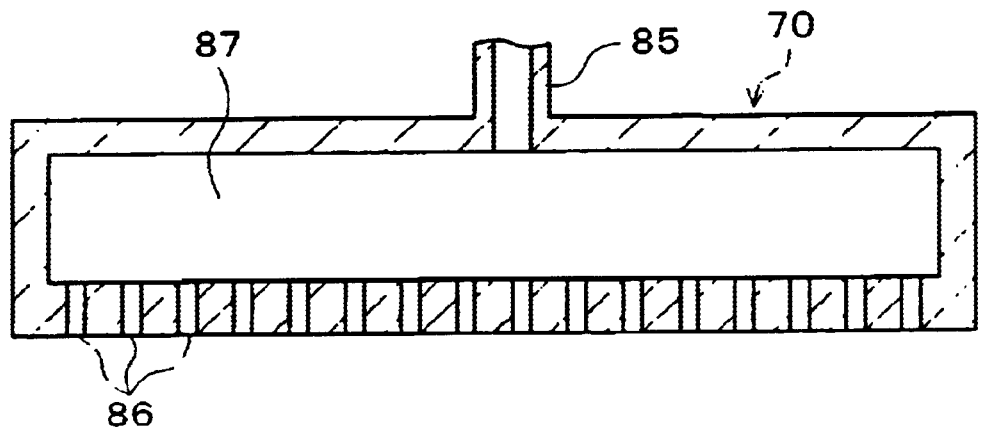
FIG. 7 is a vertical sectional view of the developing solution supply nozzle in FIG. 6.

As shown in FIG. 7, a solution reservoir 87, which is long in the longitudinal direction and communicates with the developing solution supply ports 86, is formed inside the developing solution supply nozzle 70 and structured to temporarily store therein the developing solution flowing into the developing solution supply nozzle 70 from the pipe 85 and to discharge the developing solution therefrom through the developing solution supply ports 86 simultaneously at the same flow rate and the same pressure.

As shown in FIG. 4 and FIG. 5, a washing bath 88 for washing the developing solution supply nozzle 70 is provided at a waiting position T of the developing solution supply nozzle 70 which is located outside the outer cup 66. The washing bath 88 is formed to have a cross section in a recessed form so as to catch the elongated developing solution supply nozzle 70, and stores therein a predetermined solvent for washing the developing solution adhering to the developing solution supply nozzle 70.

The casing 18a is provided with a carrier opening 90 through which the wafer W is carried in/out by the main carrier unit 13 and a shutter 91 for opening/closing the carrier opening 90. Except when the wafer W is carried in/out, the shutter 91 is closed to prevent a treatment solution from being scattered from within the casing 18a and maintain a predetermined atmosphere therein.

Next, the developing treatment method which is carried out in the developing treatment unit 18 structured as described above will be explained with a photolithography process performed in the coating and developing treatment system 1.

First, the wafer carrier 7 takes one untreated wafer W out of the cassette C and carries it into the adhesion unit 31 included in the third treatment unit group G3. The wafer W coated with an adhesion promoter such as HMDS for enhancing the adhesion to the resist solution in the adhesion unit 31 is carried to the cooling unit 30 by the main carrier unit 13 and cooled to a predetermined temperature. The wafer W cooled to the predetermined temperature is then carried to the resist coating unit 17 or 19 and coated with the resist solution to form a resist film thereon. The wafer W is then carried to the pre-baking unit 34 or 35 to undergo baking treatment, and thereafter carried to the extension and cooling unit 41.

Subsequently, the wafer W is taken out of the extension and cooling unit 41 by the wafer carrier 50, and then carried to the aligner (not illustrated) via the periphery exposure unit 51. The wafer W which has undergone exposure processing is carried to the extension unit 42 by the wafer carrier 50 and then held by the main carrier unit 13. Thereafter, the wafer W is carried to the post-exposure baking unit 44 or 45 and the cooling unit 43 in sequence, where the wafer W is subjected to predetermined treatment, and then carried to the developing treatment unit 18 or 20.

The process of developing treatment will be explained in detail. The wafer W which has undergone pretreatment is first carried into the developing treatment unit 18 by the main carrier unit 13 and suction-held on the spin chuck 60. Then, the developing solution supply nozzle 70 which has been waiting in the washing bath 88 at the waiting position T moves to a start position S (shown in FIG. 5) which is inside the cup 65 and outside one end of the wafer W.

At the start position S, the developing solution supply nozzle 70 starts to discharge the developing solution, and continues trial discharge until its discharge condition becomes stable.

Figure 8:
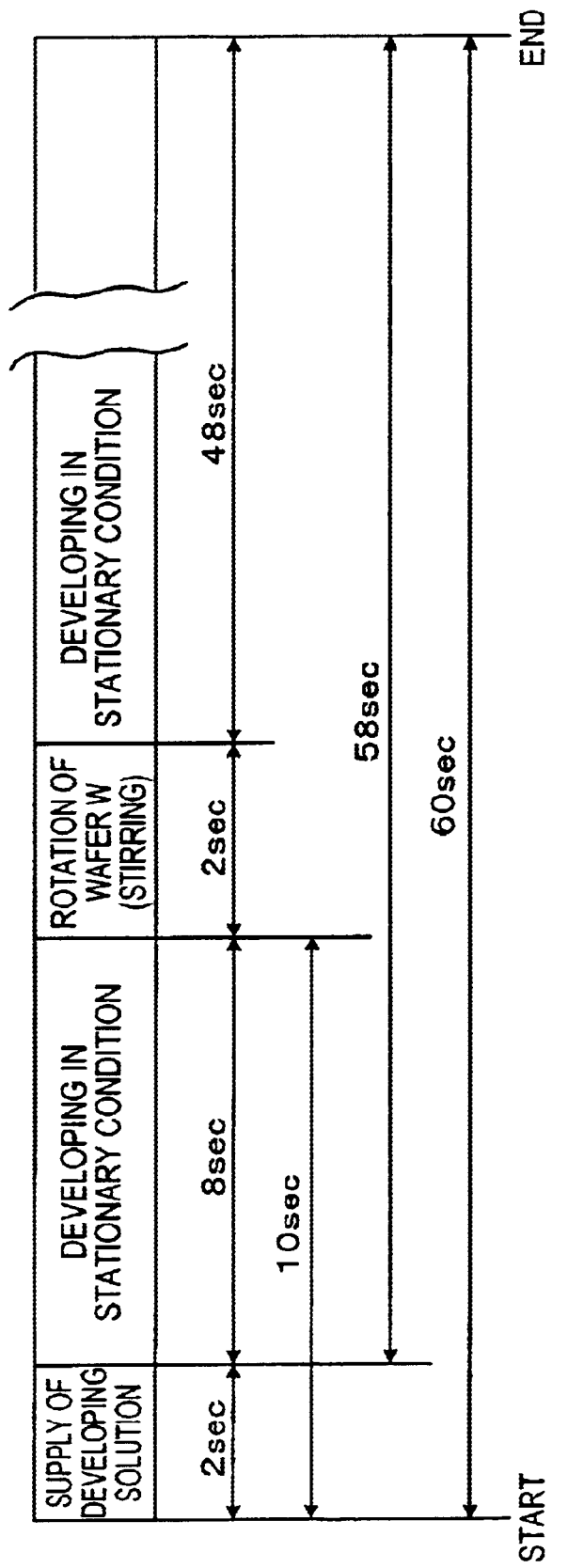
FIG. 8 is an explanatory view showing time distribution between the start of the supply of the developing solution and the end of developing.
Figure 9:
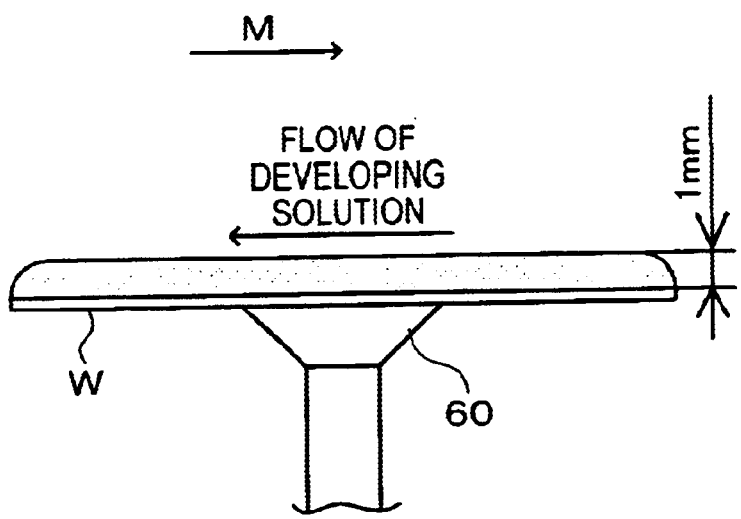
FIG. 9 is an explanatory view showing a state in which the developing solution is supplied onto a wafer and a developing solution film is formed thereon.

The step of supplying developing solution as a first step and the step of developing the wafer W as a second step will be explained below based on FIG. 8. First, the developing solution supply nozzle 70 moves from the start position S outside the one end of the wafer W to an end position E outside the other end thereof at a speed of 60 mm/s to 200 mm/s while discharging the developing solution, whereby the step of supplying the developing solution is performed. On this occasion, as shown in FIG. 9, the developing solution is supplied to the entire surface of the wafer W, resulting in the formation of a developing solution film with a predetermined thickness, for example, approximately 1 mm. Incidentally, when the diameter of the wafer W is approximately 200 mm, the developing solution supply nozzle 70 takes 1 sec. to 3 sec. to supply the developing solution as described above. On this occasion, there occurs a flow phenomenon which is so-called fluid movement of the developing solution in which the developing solution flows in a direction opposite to the movement direction of the developing solution supply nozzle 70 (in a negative direction with respect to the M-direction), that is, in a direction from the end position E to the start position S.

Simultaneously with the aforesaid supply of the developing solution onto the wafer W by the developing solution supply nozzle 70, the wafer W starts to be developed, and developing is performed while the wafer W remains stationary for a predetermined period of time, for example, for 8 sec. as a second predetermined period of time.

After the aforesaid developing in stationary condition for 8 sec. is completed (9 sec. to 11 sec. have passed since the start of the step of supplying the developing solution to the wafer W), the rotation of the wafer W as a stirring step for eliminating concentration difference which occurs due to time difference in the supply of the developing solution onto the wafer W is started. At this time, the wafer W is rotated for a predetermined rotation time, for example, 2.0 sec., at a predetermined rotation speed, for example, 1000 rpm, and at a predetermined acceleration, for example, 1000 rpm/s which are set in a developing treatment program of a unit controller not illustrated, under the control of the rotation controller 62. The values of these parameters are fixed at such values that the developing solution which is changed according to an exposure pattern in exposure is fully stirred, and that the thickness of the developing solution film remaining on the surface of the wafer W after the rotation exceeds a predetermined thickness.

Figure 10:
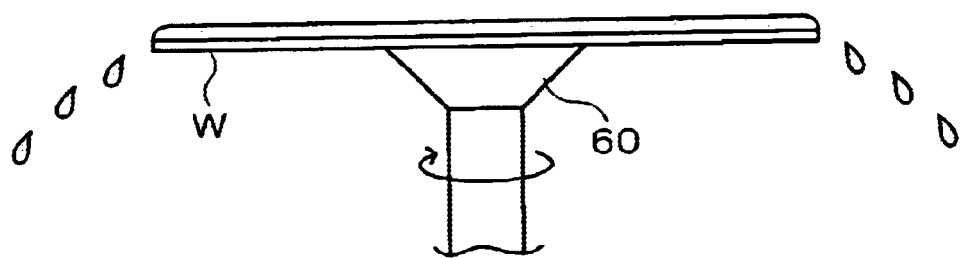
FIG. 10 is an explanatory view showing a state in which the wafer is rotated and the excess developing solution on the wafer is cast off.
Figure 11:
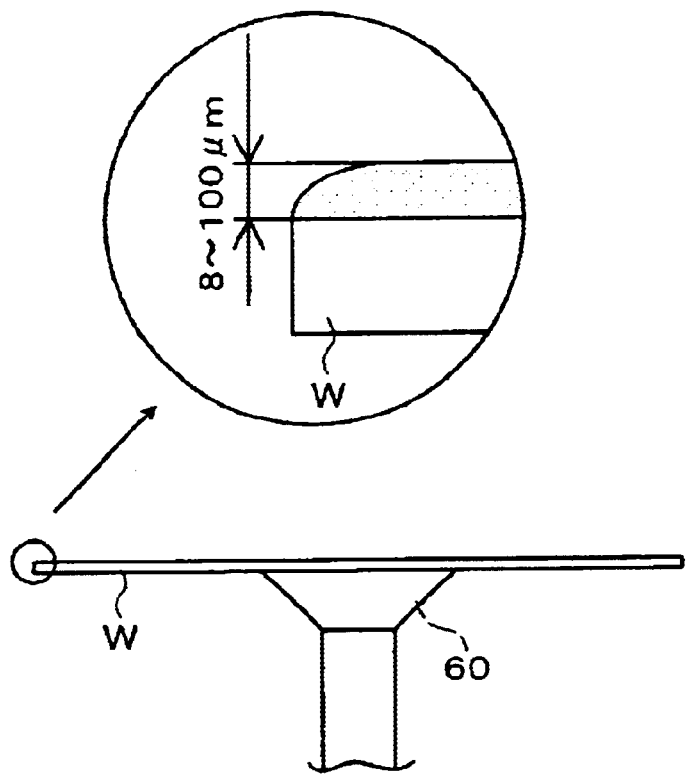
FIG. 11 is an explanatory view showing a state in which the rotation of the wafer is completed and the thin film is formed on the wafer.

When the rotation is started, as shown in FIG. 10, the developing solution on the wafer W is cast off and stirred, whereby the concentration of the developing solution within the surface of the wafer W is made uniform. After 2.0 sec. from the start of the rotation, the rotation of the wafer W is stopped, and a thin film with a predetermined thickness, for example, 8 $\mu$m to 100 $\mu$m is formed on the wafer W as shown in FIG. 11. The thickness of this thin film is changed according to pattern spacing on the wafer W.

Thereafter, the wafer W is developed again for 48 sec. in stationary condition. When such developing in stationary condition is completed, the step of developing the wafer W is completed. Accordingly, in this embodiment, the step of supplying the developing solution and the step of developing in stationary condition immediately thereafter put together are performed for 10 sec., the rotating step thereafter is performed for 2 sec., and the step of developing in stationary condition is performed again for 48 sec. Thus, putting all these steps together, the developing step is performed for 60 sec.

After the washing nozzle 71 then moves to a position above the center of the wafer W, the wafer W starts to be rotated at a predetermined speed, and the washing solution is supplied to the wafer W from the washing nozzle 71 and the rear face washing nozzle 67 to wash the wafer W. At this time, the cup 65 moves up, and thereby the washing solution and the like scattered from the wafer W is caught by the cup 65.

When the supply of the washing solution is stopped, the wafer W is rotated at a higher speed and dried. After the completion of this step of drying the wafer W, the developing treatment of the wafer W is completed, and the wafer W is carried out of the developing treatment unit 18 by the main carrier unit 13.

In the aforesaid embodiment, the developing solution is stirred by rotating the wafer W during the step of developing the wafer W, whereby ununiformity of concentration of the developing solution caused by the aforesaid so-called flow phenomenon of the developing solution is eliminated, resulting in realization of uniformity of developing speed within the surface of the wafer W. Hence, developing after the rotation of the wafer W is performed uniformly, which suppresses ununiformity of line width of a circuit pattern within the surface of the wafer W. Actually, it is recognized by experiment by the inventor, et al. that the CD uniformity by a conventional method is $3\sigma=18$ nm (in a 250 nm Line pattern), but that by this method is $3\sigma=8$ nm, which indicates that line width ununiformity is suppressed.

Further, the developing solution film remaining on the wafer W after the rotation has a predetermined thickness, that is, a thickness of 8 $\mu$m to 100 $\mu$m, which prevents the developing solution from being dried during succeeding developing treatment after the rotation and developed inappropriately.

Furthermore, the stirring step in the aforesaid embodiment is performed by rotating the wafer in one direction (normal rotation), but after this rotation, stirring may be further performed by rotating the wafer in an opposite direction (reverse rotation). The concentration of the developing solution on the wafer is made more uniform by the aforesaid normal rotation and reverse rotation.

It is preferable that the rotation speed of the wafer in reverse rotation after normal rotation be set at a speed higher than that in normal rotation, and when the wafer is rotated at a speed of 100 rpm for two seconds in normal rotation, it is recommended that in reverse rotation, the wafer be rotated at a speed higher than this speed, for example, at a speed of 250 rpm.

The aforesaid normal rotation and reverse rotation of the spin chuck 60 are controlled by the rotation controller 62. Specifically, the rotation controller 62 is programmed to control the rotary drive mechanism 61 so that the spin chuck 60 is stopped after being normally rotated for a predetermined period of time and then reversely rotated for a predetermined period of time at a speed higher than that in the normal rotation.

Moreover, it is suitable to supply the developing solution again to the surface of the wafer W while the developing solution supply nozzle 70 is moving from the other end to the one end of the wafer W in a direction opposite to the direction of the arrow in FIG. 4 after the developing solution on the wafer W is cast off by stirring. Thereby, the uniformity of developing treatment can be enhanced.

Although the step of supplying the developing solution to the entire surface of the wafer W is performed by a so-called nozzle scan in which the developing solution supply nozzle 70 supplies the developing solution while moving from the one end to the other end of the wafer W in the aforesaid embodiment, this step may be performed by supplying the developing solution to the wafer W which is being rotated while the developing solution supply nozzle 70 is stopped.

Figure 12:
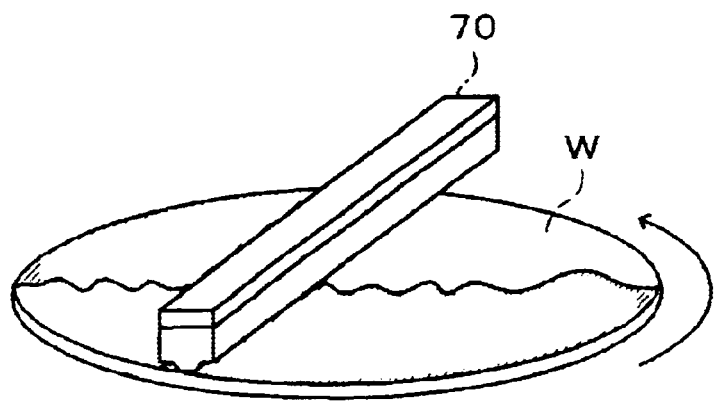
FIG. 12 is a perspective view showing another form of supply in the step of supplying the developing solution.

In this case, for example, as shown in FIG. 12, the developing solution supply nozzle 70 moves to a position above the center of the wafer W and then supplies the developing solution to the entire surface of the wafer W by discharging the developing solution onto the wafer W which is being rotated at a predetermined rotation speed, for example, at 30 rpm. Thereafter, similarly to the aforesaid embodiment, for example, developing in stationary condition is performed for 9 sec., the step of rotating the wafer W (stirring step) is performed for 2.0 sec., and thereafter developing in stationary condition is performed again for 48 sec. Thus, the developing treatment of the wafer W is completed. The performance of such a process makes developing speed within the surface of the wafer W uniform, resulting in the formation of uniform line width on the wafer W, likewise with the aforesaid embodiment.

Moreover, the developing solution supply nozzle 70 may supply the developing solution to the entire surface of the wafer W by supplying the developing solution to the wafer W when being stopped or moving above the wafer W which is being rotated.

In this case, for example, the wafer W is rotated at a high speed, for example, at 1000 rpm, and the developing solution supply nozzle 70 moves over the wafer W from the position S (shown in FIG. 5) outside the one end of the wafer W to a position above the center of the wafer W while discharging the developing solution. On this occasion, a thin film of the developing solution is formed on the wafer W. The developing solution supply nozzle 70 comes to a stop at a position above the center of the wafer W, and the rotation speed of the wafer W is reduced to, for example, 100 rpm while the developing solution is discharged. The developing solution is supplied onto the wafer W for a predetermined period of time in this state, and a developing solution film with a predetermined thickness, for example, a thickness of 1 mm is formed. After the discharge of the developing solution is stopped and the step of supplying the developing solution is completed, similarly to the aforesaid embodiment, for example, developing in stationary condition is performed for 5 sec., then the step of rotating the wafer W (stirring step) is performed for 2.0 sec., and finally developing in stationary condition is performed again for 48 sec. Thus, the developing treatment of the wafer W is completed. The performance of such a process makes developing speed within the surface of the wafer W uniform, resulting in the formation of uniform line width on the wafer W, likewise with the aforesaid embodiment.

In all cases, the developing solution may be supplied again to the surface of the wafer W from the developing solution supply nozzle 70 by rotating the wafer W in a direction opposite to the direction of the arrow in FIG. 12 after the excessive developing solution on the wafer W is thrown away by stirring, which further enhances the uniformity of developing treatment.

Figure 13:
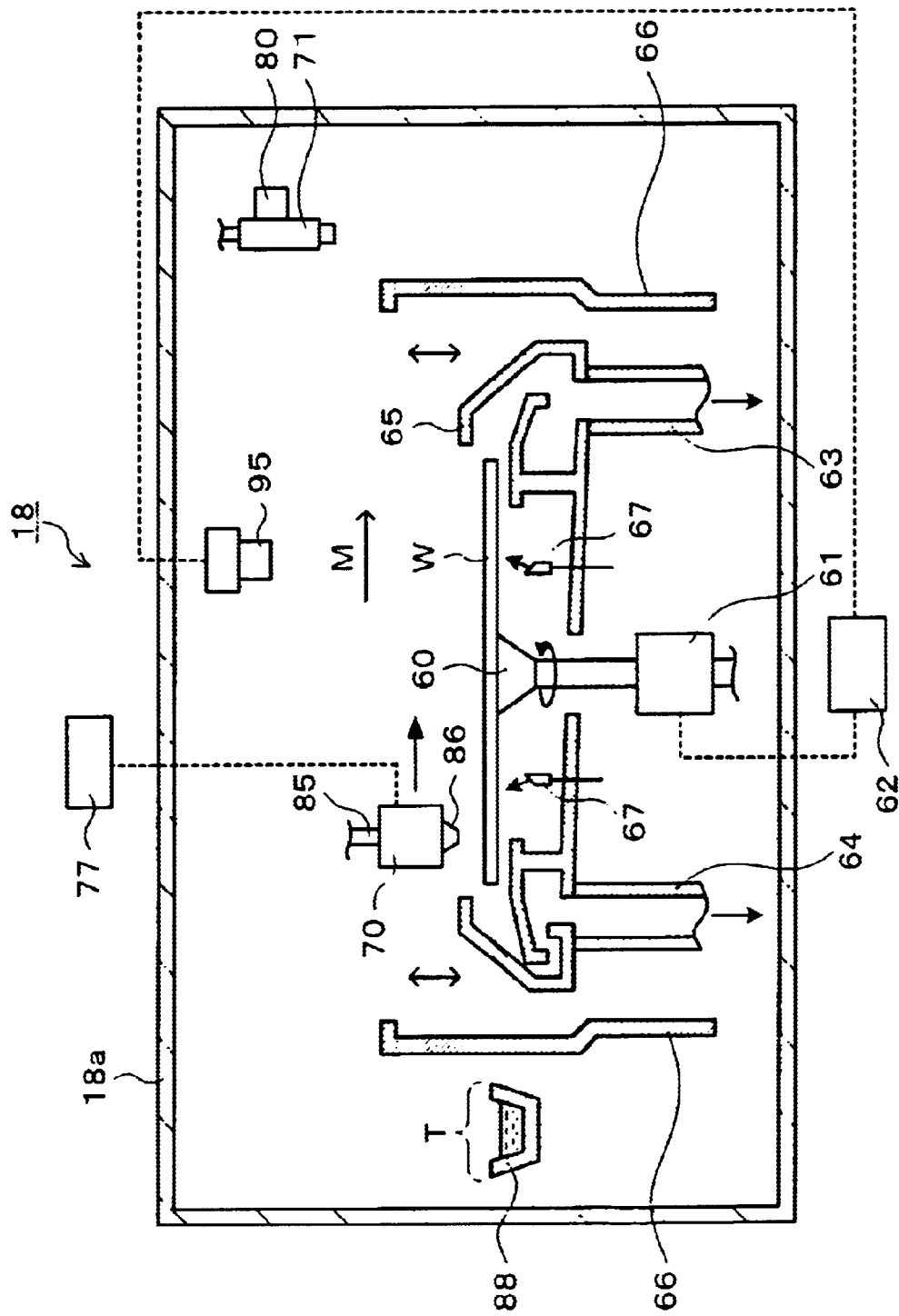
FIG. 13 is an explanatory view of a vertical section of the developing treatment unit when a laser displacement gauge for measuring the thickness of the developing solution film is provided.

In the respective developing treatment methods in the embodiments described above, it is also suitable to measure the thickness of the developing solution film after the step of stirring the developing solution and change the rotation time of the wafer W in the stirring step based on the measurement, in which case, for example, as shown in FIG. 13, a device capable of measuring the thickness of the developing solution film, for example, a laser displacement gauge 95 is provided above the spin chuck 60 in the developing treatment unit 18. A value measured by this laser displacement gauge 95 is transmitted to the rotation controller 62 for controlling the rotation of the spin chuck 60. The rotation controller 62 is given a function of appropriately changing the setting of rotation time based on the transmitted measurement, for example, a function of storing tolerable values of the developing solution film thickness, then comparing a measured film thickness with the tolerable values, and amending the setting of rotation time only when the measured value is less than the tolerable values.

After the rotation of the wafer W is stopped, the thickness of the developing solution film is measured, and the setting of rotation time is changed based on the measured value. When the thickness of the developing solution is not more than 5 μm, for example, the rotation time is changed, for example, from 2.0 sec. to 1.5 sec., and such an amend that the thickness of the developing solution film comes to exceed a predetermined thickness by a reduction in rotation time is given. By measuring the thickness of the developing solution film after rotation and changing the setting of rotation time based on the measurement, the thickness of the solution film after rotation of the wafer W to be treated next becomes appropriate, which prevents such a harmful effect that the developing solution dries due to an excessively thin thickness, causing inappropriate developing thereafter. Moreover, in case of excessively thick thickness, the rotation time may be changed so that the film thickness becomes thinner.

Incidentally, although the rotation time is changed based on the measurement of the thickness of the developing solution film, the rotation speed or the rotation acceleration of the wafer W may be changed, instead. Alternatively, all of the rotation time, rotation speed, rotation acceleration may be changed, or any two parameters out of these may be changed.

Furthermore, the rotation controller 62 may control developing time when the wafer W is developed while remaining stationary after the rotation is stopped.

The embodiments explained above concern the developing treatment method for the wafer W in photolithography of the process of fabricating a semiconductor wafer device, but the present invention can be applied to a developing treatment method for substrates other than a semiconductor wafer, for example, an LCD substrate.

According to the present invention, the stirring of a developing solution on the surface of a substrate makes the concentration of the developing solution on the substrate uniform within the surface of the substrate and the developing speed within the surface of the substrate identical, whereby developing thereafter can be performed uniformly. Consequently, the line width of a circuit pattern formed on the substrate has a predetermined width, leading to a rise in yield.

What is claimed is:

1. A method of supplying a developing solution to a surface of a substrate to perform developing treatment for the substrate, comprising:

a first step of supplying the developing solution to the surface of the substrate while a developing solution supply nozzle is moving relative to the substrate; and a second step of developing the substrate for a first predetermined period of time, said second step having the step of developing the substrate in the stationary condition while stopping the substrate for a second predetermined period of time after the completion of said first step, the step of making a concentration of the developing solution on the substrate uniform by stirring the developing solution on the surface of the substrate after the second predetermined period of time, the step of thereafter further developing the substrate in stationary condition while stopping the substrate for a third predetermined period of time, the step of washing the substrate while rotating the substrate after the third predetermined period of time, said second predetermined period of time being a period of time from the supply of developing solution to 50% to 80% of progress of the chemical reaction of developing.

2. A method as set forth in claim 1, wherein the nozzle moves parallel to the substrate in one direction in said first step.

3. A method of supplying a developing solution to a surface of a substrate to perform developing treatment for the substrate, comprising:

a first step of supplying the developing solution to the surface of the substrate while a developing solution supply nozzle is moving relative to the substrate; and a second step of developing the substrate for a first predetermined period of time, said second step having the step of developing the substrate in stationary condition while stopping the substrate for a second predetermined period of time after the completion of said first step, the step of making a concentration of the developing solution on the substrate uniform by stirring the developing solution on the surface of the substrate after the second predetermined period of time, wherein said stirring step is performed by rotating the substrate; the step of thereafter further developing the substrate in stationary condition while stopping the substrate for a third predetermined period of time, the step of washing the substrate while rotating the substrate after the third predetermined period of time; the step of measuring a thickness of the developing solution after said step of stirring the developing solution; and the step of changing at least one of a rotation time of the substrate based on the thickness measurement, a rotation speed of the substrate based on the thickness measurement, and a rotation acceleration of the substrate based on the thickness measurement.

4. A method as set forth in claim 1, wherein said stirring step by rotation is performed by normally rotating the substrate and then reversely rotating the substrate.

5. A method as set forth in claim 4, wherein the reverse rotation is performed at a speed higher than a rotation speed in the normal rotation.

6. A method as set forth in claim 1, wherein the substrate is rotated so that a thickness of the developing solution after said step of stirring the developing solution is not less than a predetermined thickness.

7. A method as set forth in claim 1,
wherein the developing solution supply nozzle supplies the developing solution to the substrate while moving from a first end to a second end of the substrate in said first step.

8. A method as set forth in claim 1,
wherein the developing solution supply nozzle supplies the developing solution to the substrate while moving from a first end to a second end of the substrate in said first step.

9. A method as set forth in claim 7, further comprising the step of:
supplying the developing solution again to the surface of the substrate while moving the developing solution supply nozzle from the second end to the first end of the substrate after said stirring step.

10. A method as set forth in claim 8, further comprising the step of:
supplying the developing solution again to the surface of the substrate while moving the developing solution supply nozzle from the second end to the first end of the substrate after the stirring step.

11. A method as set forth in claim 1,
wherein the developing solution is supplied to the substrate while the developing solution supply nozzle is stopped above the substrate and the substrate is rotated in said first step.

12. A method as set forth in claim 11, further comprising the step of:
supplying the developing solution again to the substrate after said stirring step while the developing solution supply nozzle is stopped above the substrate and the substrate is rotated in a direction opposite to the rotation direction in which the substrate is rotated in said first step.

13. A method as set forth in claim 1,
wherein the developing solution is supplied to the substrate while the developing solution supply nozzle is stopped or moving above the substrate with the substrate being rotated in said first step.

14. A method as set forth in claim 13, further comprising the step of:
supplying the developing solution again to the substrate after said stirring step while the developing solution supply nozzle is stopped or moving above the substrate with the substrate being rotated in a direction opposite to the rotation direction in which the substrate is rotated in said first step.

* * * * *